US012751086B2

(12) United States Patent
Shin et al.

(10) Patent No.: US 12,751,086 B2
(45) Date of Patent: Sep. 29, 2026

(54) DISPLAY DEVICE

(71) Applicant: Samsung Display Co., Ltd., Yongin-si (KR)

(72) Inventors: Dong Hee Shin, Yongin-si (KR); Byoungsun Na, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 886 days.

(21) Appl. No.: 18/089,737

(22) Filed: Dec. 28, 2022

(65) Prior Publication Data

US 2023/0343792 A1 Oct. 26, 2023

(30) Foreign Application Priority Data

Apr. 21, 2022 (KR) ........................ 10-2022-0049711

(51) Int. Cl.

| | |
|---|---|
| ***H10D 86/60*** | (2025.01) |
| ***G09G 3/20*** | (2006.01) |
| ***H10D 86/40*** | (2025.01) |

(52) U.S. Cl.

CPC ............... *H10D 86/60* (2025.01); *G09G 3/20* (2013.01); *H10D 86/441* (2025.01); *G09G 2300/0426* (2013.01); *G09G 2310/0202* (2013.01); *G09G 2310/0267* (2013.01); *G09G 2310/0275* (2013.01); *G09G 2320/0233* (2013.01)

(58) Field of Classification Search

CPC ........ H10D 86/60; H10D 86/441; G09G 3/20; G09G 2300/0426; G09G 2310/0202; G09G 2310/0267; G09G 2310/0275; G09G 2320/0233

See application file for complete search history.

(56) References Cited

U.S. PATENT DOCUMENTS

| | | | | |
|---|---|---|---|---|
| 9,190,003 | B2 | 11/2015 | Kim et al. | |
| 9,389,476 | B2 | 7/2016 | Park et al. | |
| 9,633,595 | B2 | 4/2017 | Hwang et al. | |
| 11,415,851 | B2 | 8/2022 | Shin et al. | |
| 11,869,873 | B2 | 1/2024 | Shin et al. | |
| 2014/0319515 | A1* | 10/2014 | Nagayama ........... | H10D 30/673 257/43 |
| 2015/0187309 | A1* | 7/2015 | Kim .................. | H10D 30/6745 345/87 |

(Continued)

FOREIGN PATENT DOCUMENTS

| | | | | |
|---|---|---|---|---|
| JP | H11237641 A * | 8/1999 | ........... | G09G 3/3614 |
| KR | 10-2004710 | 7/2019 | | |

(Continued)

*Primary Examiner* — Fatima N Farokhrooz

(74) *Attorney, Agent, or Firm* — F. CHAU & ASSOCIATES, LLC

(57) ABSTRACT

A display device includes a display panel including pixels, data lines, first gate lines, auxiliary lines, and second gate lines electrically connected to the first gate lines, respectively, a first circuit film including a first gate driver and a first data driver, and a second circuit film spaced apart from the first circuit film and including a second gate driver and a second data driver. The first gate lines include first partial gate lines that receive a signal from the first gate driver, and second partial gate lines that receive a signal from the second gate driver. At least some of the auxiliary lines are disposed between the first partial gate lines and the second partial gate lines.

18 Claims, 9 Drawing Sheets

(56) References Cited

U.S. PATENT DOCUMENTS

| | | | | |
|---|---|---|---|---|
| 2017/0365217 | A1* | 12/2017 | An | G09G 3/3258 |
| 2020/0159077 | A1* | 5/2020 | Yoshida | H10D 86/481 |
| 2020/0185638 | A1* | 6/2020 | Choi | H10K 59/38 |
| 2021/0376283 | A1* | 12/2021 | Shin | H10K 59/124 |
| 2022/0109040 | A1* | 4/2022 | Jung | H10K 59/131 |
| 2023/0014733 | A1* | 1/2023 | Hong | G09G 3/2096 |
| 2023/0077261 | A1* | 3/2023 | Baek | H10K 59/1315 |
| 2023/0209982 | A1* | 6/2023 | Kim | H10K 50/86<br>257/40 |

FOREIGN PATENT DOCUMENTS

| | | | | |
|---|---|---|---|---|
| KR | 10-2034112 | | 10/2019 | |
| KR | 10-2045312 | | 11/2019 | |
| KR | 10-2062917 | | 1/2020 | |
| KR | 10-2284296 | | 8/2021 | |
| KR | 10-2021-0127847 | A | 10/2021 | |
| KR | 10-2022-0034271 | A | 3/2022 | |
| WO | WO-2014069529 | A1 * | 5/2014 | G02F 1/133308 |

* cited by examiner

DISPLAY DEVICE

CROSS-REFERENCE TO RELATED APPLICATION(S)

This application claims priority to and benefits of Korean Patent Application No. 10-2022-0049711 under 35 U.S.C. § 119, filed on Apr. 21, 2022, in the Korean Intellectual Property Office (KIPO), the entire contents of which are incorporated herein by reference.

BACKGROUND

1. Technical Field

Embodiments relate to a display device having improved display quality.

2. Description of the Related Art

A display device includes a display panel including pixels and a driver for driving the pixels. The driver is mounted on a flexible film, and the flexible film is connected to the display panel. A pad of the flexible film may be electrically connected to a pad of the display panel by an anisotropic conductive film, or may be connected to the pad of the display panel by an ultrasonic bonding method.

SUMMARY

Embodiments provide a display device capable of improving display quality.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a display device may include a display panel including a plurality of pixels, a plurality of data lines arranged in a first direction, a plurality of first gate lines arranged in the first direction, a plurality of auxiliary lines arranged in the first direction, and a plurality of second gate lines arranged in a second direction intersecting the first direction and electrically connected to the plurality of first gate lines, a first circuit film that is coupled to the display panel and that includes a first gate driver and a first data driver, and a second circuit film that is coupled to the display panel and spaced apart from the first circuit film in the first direction and that includes a second gate driver and a second data driver. The plurality of first gate lines include a plurality of first partial gate lines that receive a signal from the first gate driver and a plurality of second partial gate lines that receive a signal from the second gate driver, and at least some of the plurality of auxiliary lines are disposed between the plurality of first partial gate lines and the plurality of second partial gate lines.

The plurality of pixels may include a first pixel and a second pixel adjacent to each other in the first direction, and the plurality of first gate lines may include at least two first intermediate gate lines disposed between the first pixel and the second pixel.

The plurality of pixels may further include a third pixel adjacent to the second pixel in the second direction. The plurality of second gate lines may include two second intermediate gate lines spaced apart from each other, and the first pixel and the second pixel may be disposed between two second intermediate gate lines. One of the at least two first intermediate gate lines may be electrically connected to one of the at least two second intermediate gate lines through a first contact portion. Another one of the at least two first intermediate gate lines may be electrically connected to another one of the at least two second intermediate gate lines through a second contact portion.

The display panel may further include an overlapping area that is disposed between the first pixel and the second pixel and that extends in the second direction to cross an entire width of the display panel in the second direction, and a number of contact portions disposed in the overlapping area among contact portions through which the plurality of first gate lines are electrically connected to the plurality of second gate lines, respectively, may be two.

The plurality of pixels may include a first pixel and a second pixel adjacent to each other in the first direction, the plurality of first gate lines may include at least one first gate line disposed between the first pixel and the second pixel, and the plurality of auxiliary lines may include at least one auxiliary line disposed between the first pixel and the second pixel.

The display panel may further include an overlapping area that is disposed between the first pixel and the second pixel and that extends in the second direction to cross an entire width of the display panel in the second direction, and a number of contact portions disposed in the overlapping area among contact portions through which the plurality of first gate lines are electrically connected to the plurality of second gate lines, respectively, may be one.

Each of the plurality of pixels may include a first sub-pixel, a second sub-pixel, and a third sub-pixel, and at least two first gate lines among the plurality of first gate lines and at least three data lines among the plurality of data lines may be spaced apart from each other, and the first, second, and third sub-pixels may be disposed between the at least two first gate lines and the at least three data lines.

Each of the plurality of pixels may include a first sub-pixel, a second sub-pixel, and a third sub-pixel, and at least one first gate line among the plurality of first gate lines and at least one auxiliary line among the plurality of auxiliary lines may be spaced apart from at least three data lines among the plurality of data lines, and the first, second, and third sub-pixels may be disposed between the at least one first gate line, the at least one auxiliary line, and the at least three data lines.

The display panel may include a first area in which the first partial gate lines are disposed and a second area in which the second partial gate lines are disposed, and each of the first area and the second area may include a central area, and a first outer area and a second outer area spaced apart from each other, and the central area may be disposed between the first outer area and the second outer area.

The plurality of auxiliary lines may be disposed only in the first outer area and the second outer area, and in each of the first outer area and the second outer area, the plurality of auxiliary lines and the plurality of first gate lines may alternately arranged one by one.

A minimum gap between first gate lines disposed in the central area among the plurality of first gate lines may be smaller than a minimum gap between first gate lines disposed in the first outer area among the plurality of first gate lines.

The plurality of auxiliary lines may be disposed only in the central area, and in the central area, the plurality of auxiliary lines and the plurality of first gate lines may alternately arranged one by one.

A minimum gap between first gate lines disposed in the central area among the plurality of first gate lines may be greater than a minimum gap between first gate lines disposed in the first outer area among the plurality of first gate lines.

A gate-off voltage or a low-potential voltage may be applied to the plurality of auxiliary lines.

According to an embodiment, a display device may include a display panel including a plurality of pixels, a plurality of data lines arranged in a first direction, a plurality of first gate lines arranged in the first direction, a plurality of auxiliary lines arranged in the first direction, and a plurality of second gate lines arranged in a second direction intersecting the first direction and electrically connected to the plurality of first gate lines, and a first circuit film that is coupled to the display panel and that includes a first gate driver and a first data driver. At least two first gate lines among the plurality of first gate lines are disposed between two adjacent pixels adjacent to each other in the first direction among the plurality of pixels, and at least one first gate line among the plurality of first gate lines and at least one auxiliary line among the plurality of auxiliary lines are disposed between other two adjacent pixels adjacent to each other in the first direction among the plurality of pixels.

A gate-off voltage or a low-potential voltage may be applied to the plurality of auxiliary lines.

The display panel may further include a first overlapping area that is disposed between the two adjacent pixels and that extends in the second direction to cross an entire width of the display panel in the second direction, and a number of contact portions disposed in the first overlapping area among contact portions through which the plurality of first gate lines are electrically connected to the plurality of second gate lines, respectively, may be two. The display panel may further include a second overlapping area that is disposed between the other two adjacent pixels and that extends in the second direction to cross an entire width of the display panel in the second direction, and a number of contact portions disposed in the second overlapping area among the contact portions through which the plurality of first gate lines are electrically connected to the plurality of second gate lines, respectively, may be one.

The display device may further include a second circuit film that is coupled to the display panel and spaced apart from the first circuit film in the first direction and that includes a second gate driver and a second data driver. The display panel may include a first area in which some of the first gate lines that receive a signal from the first gate driver are disposed and a second area in which other first gate lines that receive a signal from the second gate driver are disposed, and each of the first area and the second area may include a central area, and a first outer area and a second outer area spaced apart from each other, and the central area may be disposed between the first outer area and the second outer area.

The two adjacent pixels may be disposed in the central area, and the other two adjacent pixels may be disposed in the first outer area or the second outer area.

The two adjacent pixels may be disposed in the first outer area or the second outer area, and the other two adjacent pixels may be disposed in the central area.

BRIEF DESCRIPTION OF THE DRAWINGS

The above and other objects and features of the disclosure will become apparent by describing in detail embodiments thereof with reference to the accompanying drawings.

DETAILED DESCRIPTION OF THE EMBODIMENTS

Figure 1:
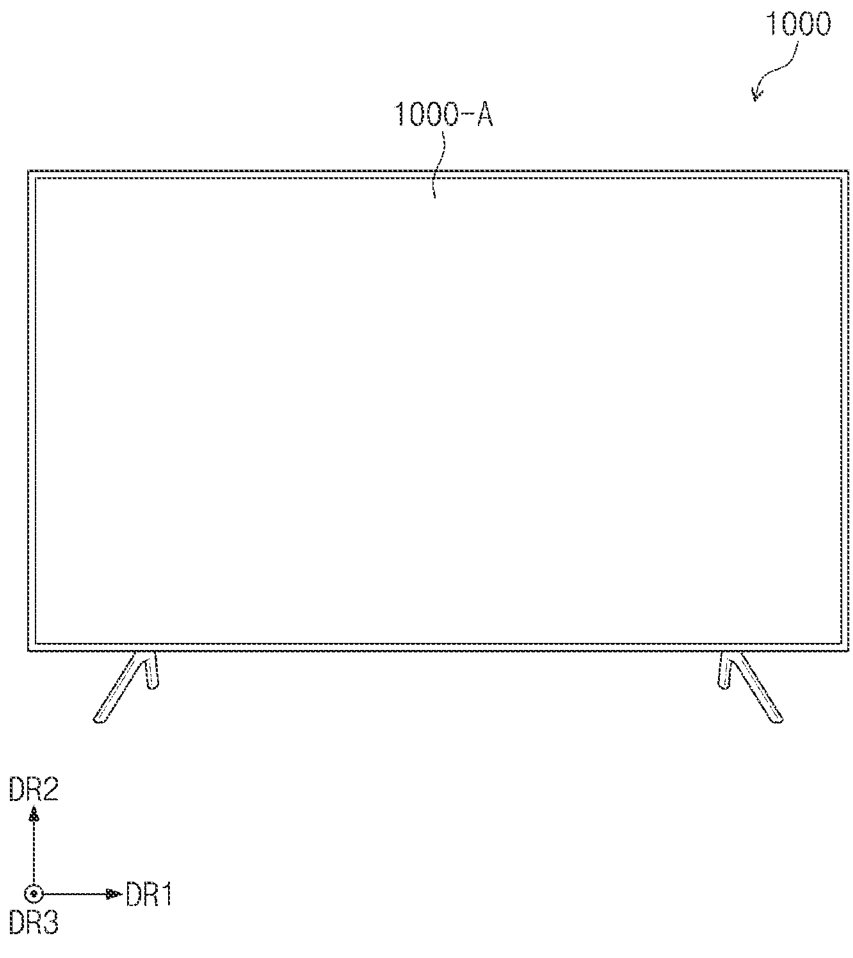
FIG. 1 is a schematic plan view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, embodiments of the disclosure will be described with reference to the accompanying drawings.

Figure 2:
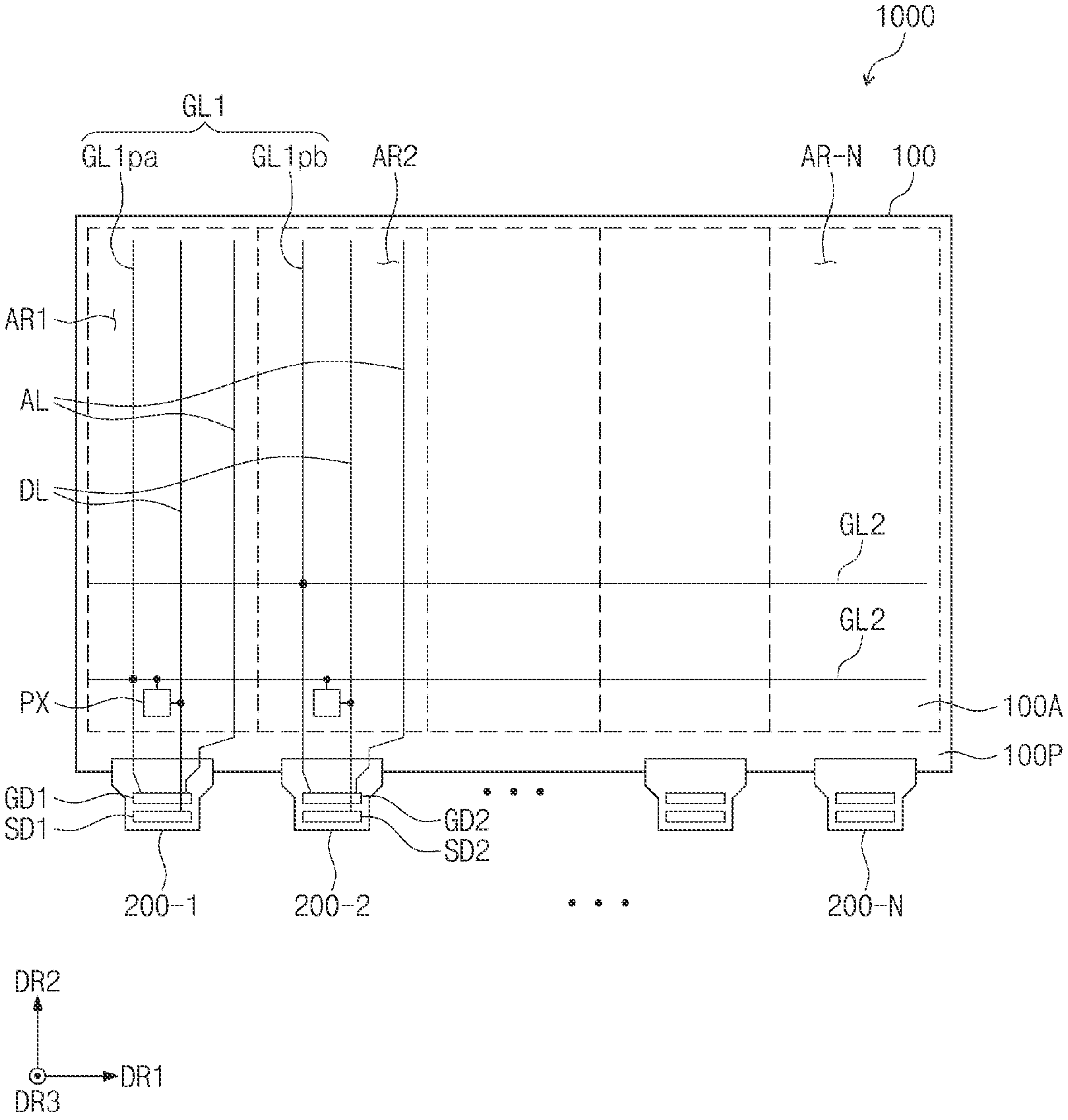
FIG. 2 is a schematic plan view illustrating some components of the display device according to an embodiment.

FIG. 1 is a schematic plan view of a display device 1000 according to an embodiment. FIG. 2 is a schematic plan view illustrating some components of the display device 1000 according to an embodiment.

Referring to FIGS. 1 and 2, the display device 1000 may be a device activated in response to an electrical signal. The display device 1000 may be applied to various products. For example, the display device 1000 may be applied to small and medium-sized electronic devices, such as a personal computer, a notebook computer, a personal digital assistant, a car navigation unit, a game machine, a portable electronic device, and a camera, as well as large electronic devices, such as a television, a monitor, and outdoor signage. The aforementioned examples are presented as embodiments, and the display device 1000 may be employed in other electronic devices without departing from the concept. In FIG. 1, the display device 1000 is illustrated as a television.

The display device 1000 may display an image in a third direction DR3 through a display surface 1000-A parallel to a first direction DR1 and a second direction DR2. The image may include a still image as well as a dynamic image.

A bezel of the display device 1000 may be defined as an area between the periphery of the display surface 1000-A and the periphery of the display device 1000. In case that the width of the bezel is decreased, the display surface 1000-A may be increased. In case that a video wall is formed by connecting display devices 1000, the boundaries between the display devices 1000 may not be visually recognized as the widths of bezels are decreased. Thus, an effect of viewing a single screen may be implemented.

The display device 1000 may include a display panel 100 and circuit films 200-1 to 200-N coupled to the display panel 100. The display panel 100 may include an active area 100A and a peripheral area 100P. The active area 100A may be an area activated in response to an electrical signal. For example, the active area 100A may be an area where an image is displayed. The peripheral area 100P may surround the active area 100A. The circuit films 200-1 to 200-N may be coupled to the peripheral area 100P.

According to an embodiment, each of the circuit films 200-1 to 200-N may be coupled to overlap a side of the display panel 100. For example, the circuit films 200-1 to 200-N may be coupled to a single side of the display panel 100 that extends in the first direction DR1. Accordingly, the circuit films 200-1 and 200-N may be spaced apart from each other in the first direction DR1.

As the circuit films 200-1 to 200-N are disposed at the single side, the area of the peripheral area 100P adjacent to the remaining three sides of the display panel 100 may be reduced. Accordingly, the width of the bezel of the display device 1000 adjacent to the remaining three sides of the display panel 100 may be minimized.

The circuit films 200-1 to 200-N may include the first circuit film 200-1, the second circuit film 200-2, and the N-th circuit film 200-N. N may be an integer of 3 or larger. Although four circuit films are illustrated in FIG. 2, embodiments are not limited thereto. For example, in case that the display panel 100 has a resolution of 8K, 24 circuit films may be coupled to the display panel 100. However, this is an example, and in case that the display panel 100 has a resolution of 8K, the number of circuit films 200-1 to 200-N may be changed according to the number of channels of data drivers.

The first circuit film 200-1 may include a first gate driver GD1 and a first data driver SD1. The second circuit film 200-2 may include a second gate driver GD2 and a second data driver SD2. Each of the remaining circuit films may include a gate driver and a data driver.

According to an embodiment, the first and second gate drivers GD1 and GD2 are included in the first and second circuit films 200-1 and 200-2 coupled to a long side of the display panel 100 that extends in the first direction DR1. Accordingly, the first and second gate drivers GD1 and GD2 are not disposed at short sides of the display panel 100 that extend in the second direction DR2. Thus, the widths of the bezel adjacent to the short sides of the display panel 100 may be decreased.

The display panel 100 may include pixels PX, data lines DL arranged (e.g., sequentially disposed) in the first direction DR1, first gate lines GL1 arranged (e.g., sequentially disposed) in the first direction DR1, auxiliary lines AL arranged (e.g., sequentially disposed) in the first direction DR1, and second gate lines GL2 arranged (e.g., sequentially disposed) in the second direction DR2.

The number of first gate lines GL1 and the number of second gate lines GL2 may be equal to each other. The first gate lines GL1 may be electrically connected to the second gate lines GL2 in a one-to-one correspondence. For example, one first gate line GL1 may be electrically connected to one second gate line GL2 by making contact with the one second gate line GL2. The first gate lines GL1 may be referred to as vertical gate lines, and the second gate lines GL2 may be referred to as horizontal gate lines.

The first gate lines GL1 may include first gate lines GL1*pa* (referred to as first partial gate lines) that receive a signal from the first gate driver GD1 and first gate lines GL1*pb* (referred to as second partial gate lines) that receive a signal from the second gate driver GD2.

The active area 100A of the display panel 100 may include first to N-th areas AR1 to AR-N. The first partial gate lines GL1*pa* may be disposed in the first area AR1, the second partial gate lines GL1*pb* may be disposed in the second area AR2, and the N-th partial gate lines may be disposed in the N-th area AR-N.

Figure 3A:
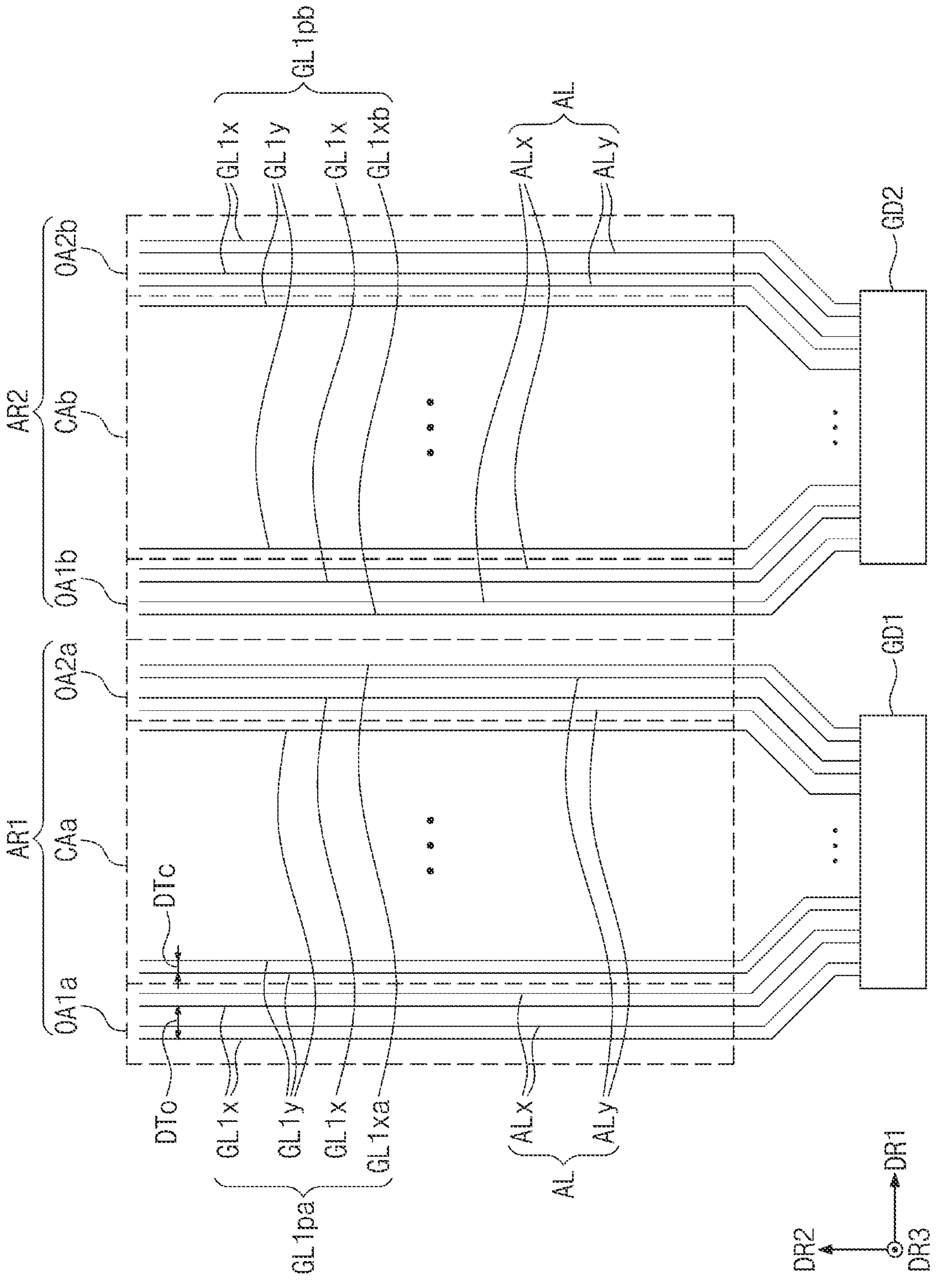
FIG. 3A is a schematic plan view illustrating some components of the display device according to an embodiment.

FIG. 3A is a schematic plan view illustrating some components of the display device according to an embodiment.

Referring to FIGS. 2 and 3A, the first area AR1 and the second area AR2 are illustrated as an example. The first area AR1 may include a central area CAa, and a first outer area OA1*a* and a second outer area OA2*a* spaced apart from each other, and the central area CAa may be disposed between the first outer area OA1*a* and the second outer area OA2*a*. The second area AR2 may include a central area CAb, and a first outer area OA1*b* and a second outer area OA2*b* spaced apart from each other, and the central area CAb may be disposed between the first outer area OA1*b* and the second outer area OA2*b*.

Hereinafter, the first partial gate lines GL1*pa* disposed in the first area AR1 and the auxiliary lines AL disposed in the first area AR1 will be described. The first gate lines GL1 disposed in the second to N-th areas AR2 to AR-N and the auxiliary lines AL disposed in the second to N-th areas AR2 to AR-N illustrated in FIG. 2 may have substantially the same arrangement as those in the first area AR1. Thus, descriptions thereabout will be omitted for descriptive convenience.

In an embodiment, the auxiliary lines AL may not be disposed in the central area CAa of the first area AR1. The auxiliary lines AL may be disposed only in the first outer area OA1*a* and the second outer area OA2*a*. Accordingly, auxiliary lines ALx and auxiliary lines ALy among the auxiliary lines AL may be disposed on opposite sides of first gate lines GL1*y* disposed in the central area CAa among the first partial gate lines GL1*pa*.

In the first outer area OA1*a*, the auxiliary lines ALx may alternate with some gate lines GL1*x* among the first partial gate lines GL1*pa*. The auxiliary lines ALx and some gate lines GL1*x* among the first partial gate lines GL1*pa* may alternately arranged one by one. In the first outer area OA1*a*, one auxiliary line ALx may be disposed between two first gate lines GL1*x*. Furthermore, in the second outer area OA2*a*, the auxiliary lines ALy may alternate with other gate lines GL1*x* among the first partial gate lines GL1*pa*.

The number of auxiliary lines AL disposed between the first partial gate lines GL1*pa* and the second partial gate lines GL1*pb* among the auxiliary lines AL may be less than two. The number of auxiliary lines AL disposed between a first gate line GL1*xa* closest to the second partial gate lines GL1*pb* among the first partial gate lines GL1*pa* and a first gate line GL1*xb* closest to the first partial gate lines GL1*pa* among the second partial gate lines GL1*pb* may be zero, one, or two. For example, a difference in load between a pixel receiving a scan signal from the first gate driver GD1 and a pixel receiving a scan signal from the second gate driver GD2 among pixels adjacent in the second direction DR2 may be decreased. Thus, a luminance difference caused by the load difference may be decreased, and the display quality of the display device 1000 (refer to FIG. 1) may be improved or enhanced.

In an embodiment, the number of first gate lines GL1*y* disposed in the central area CAa may be larger than the number of first gate lines GL1*x* disposed in the first outer area OA1*a* and the number of first gate lines GL1*x* disposed in the second outer area OA2*a*. The number of first gate lines GL1*x* disposed in the first outer area OA1*a* may be equal to the number of first gate lines GL1*x* disposed in the second outer area OA2*a*. The number of auxiliary lines ALx disposed in the first outer area OA1*a* may be equal to the number of first gate lines GL1*x* disposed in the first outer area OA1*a*, and the number of auxiliary lines ALy disposed in the second outer area OA2*a* may be equal to the number of first gate lines GL1*x* disposed in the second outer area OA2*a*.

For example, four hundreds forty (440) first gate lines GL1*y* may be disposed in the central area CAa. Fifty (50) first gate lines GL1*x* may be disposed in the first outer area OA1*a*, and fifty (50) first gate lines GL1*x* may be disposed in the second outer area OA2*a*. Fifty (50) auxiliary lines ALx may be disposed in the first outer area OA1*a*, and fifty (50) auxiliary lines ALy may be disposed in the second outer area OA2*a*.

Figure 3B:
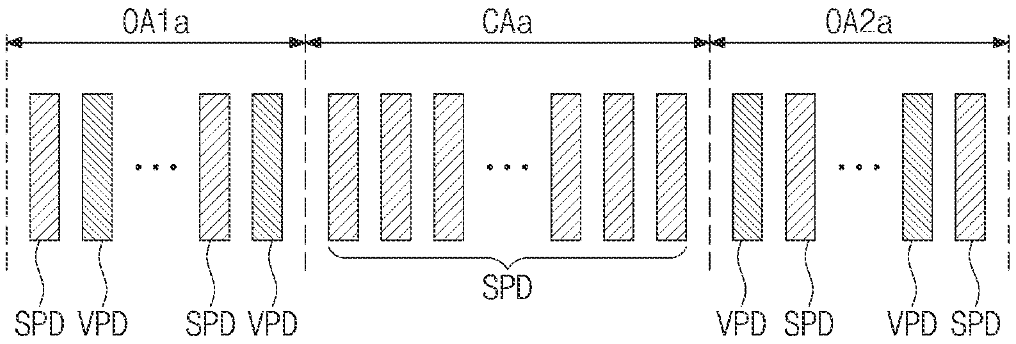
FIG. 3B is a schematic plan view illustrating a plurality of pads according to an embodiment.

FIG. 3B is a schematic plan view illustrating pads according to an embodiment.

Referring to FIGS. 3A and 3B, first pads SPD to which a scan signal is applied and second pads VPD to which power is applied are illustrated. The power may be a gate-off voltage or a low-potential voltage. For example, the gate-off voltage may be a voltage that turns off a thin film transistor of a pixel PX (refer to FIG. 2). The low-potential voltage may be a voltage provided to a cathode of a light emitting element of the pixel PX (refer to FIG. 2). In another example, the low-potential voltage may be a ground voltage.

The first pads SPD may be connected to the first partial gate lines GL1*pa*, respectively, and the second pads VPD may be connected to the respective auxiliary lines AL disposed in the first area AR1. For example, in case that the low-potential voltage is applied to the auxiliary lines AL, the auxiliary lines AL may be electrically connected to the cathode of the light emitting element.

One first pad SPD and one second pad VPD may be alternately and repeatedly arranged in the first direction DR1 to correspond to the first outer area OA1*a*, first pads SPD may be arranged in the first direction DR1 to correspond to the central area CAa, and one second pad VPD and one first pad SPD may be alternately and repeatedly arranged in the first direction DR1 to correspond to the second outer area OA2*a*.

Figure 4A:
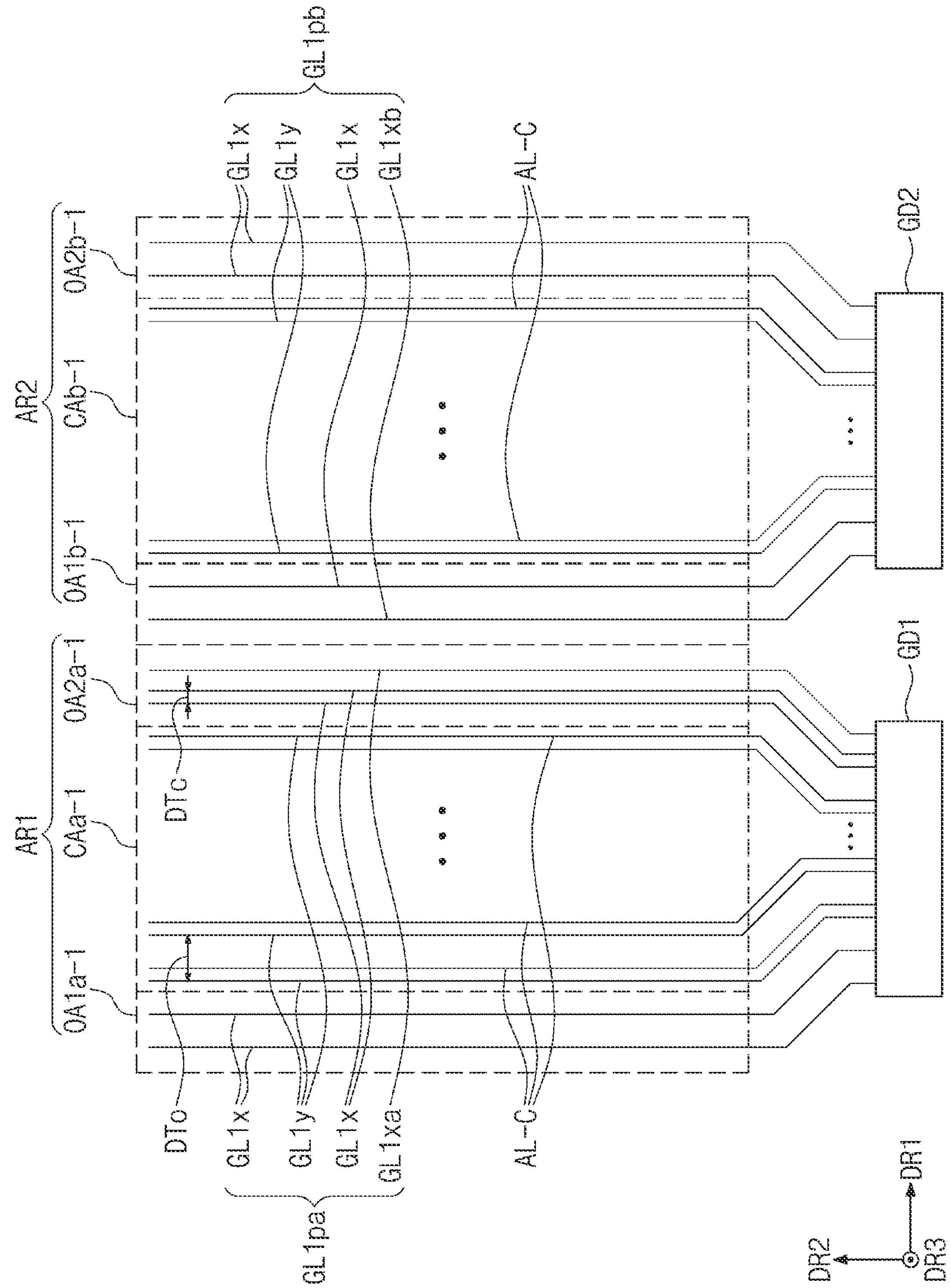
FIG. 4A is a schematic plan view illustrating some components of the display device according to an embodiment.

FIG. 4A is a schematic plan view illustrating some components of the display device according to an embodiment.

Referring to FIGS. 2 and 4A, the first area AR1 and the second area AR2 are illustrated as an example. The first area AR1 may include a central area CAa-1, and a first outer area OA1*a*-1 and a second outer area OA2*a*-1 spaced apart from each other, and the central area CAa-1 may be disposed between the first outer area OA1*a*-1 and the second outer area OA2*a*-1. The second area AR2 may include a central area CAb-1, and a first outer area OA1*b*-1 (referred to as the third outer area) and a second outer area OA2*b*-1 (referred to as the fourth outer area) that are spaced apart from each other, and the central area CAb-1 may be disposed between the first outer area OA1*b*-1 and the second outer area OA2*b*-1.

Auxiliary lines AL-C may not be disposed in the first outer area OA1*a*-1 and the second outer area OA2*a*-1. The auxiliary lines AL-C may be disposed only in the central area CAa-1. In the central area CAa-1, the auxiliary lines AL-C may alternate with some gate lines GL1*y* among the first partial gate lines GL1*pa*. In the central area CAa-1, one auxiliary line AL-C may be disposed between two first gate lines GL1*y*.

In the first outer area OA1*a*-1, other gate lines GL1*x* among the first partial gate lines GL1*pa* may be arranged in the first direction DR1, and in the second outer area OA2*a*-1, other gate lines GL1*x* among the first partial gate lines GL1*pa* may be arranged in the first direction DR1.

The number of auxiliary lines AL-C disposed between the first partial gate lines GL1*pa* and the second partial gate lines GL1*pb* among the auxiliary lines AL-C may be less than two. For example, the number of auxiliary lines AL-C disposed between a first gate line GL1*xa* closest to the second partial gate lines GL1*pb* among the first partial gate lines GL1*pa* and a first gate line GL1*xb* closest to the first partial gate lines GL1*pa* among the second partial gate lines GL1*pb* may be zero. For example, a difference in load between a pixel receiving a scan signal from the first gate driver GD1 and a pixel receiving a scan signal from the second gate driver GD2 among pixels adjacent in the second direction DR2 may be decreased. Thus, a luminance difference caused by the load difference may be decreased, and the display quality of the display device 1000 (refer to FIG. 1) may be improved or enhanced.

In an embodiment, the number of first gate lines GL1*y* disposed in the central area CAa-1 may be smaller than the number of first gate lines GL1*x* disposed in the first outer area OA1*a*-1 and the number of first gate lines GL1*x* disposed in the second outer area OA2*a*-1. The number of first gate lines GL1*x* disposed in the first outer area OA1*a*-1 may be equal to the number of first gate lines GL1*x* disposed in the second outer area OA2*a*-1. The number of auxiliary lines AL-C disposed in the central area CAa-1 may be equal to the number of first gate lines GL1*y* disposed in the central area CAa-1, and the difference between the number of auxiliary lines AL-C disposed in the central area CAa-1 and the number of first gate lines GL1*y* disposed in the central area CAa-1 may be 1 or less.

For example, one hundred (100) first gate lines GL1*y* may be disposed in the central area CAa-1, and one hundred (100) auxiliary lines AL-C may be disposed in the central area CAa-1. Two hundreds twenty (220) first gate lines GL1*x* may be disposed in the first outer area OA1*a*-1, and two hundreds twenty (220) first gate lines GL1*x* may be disposed in the second outer area OA2*a*-1.

Figure 4B:
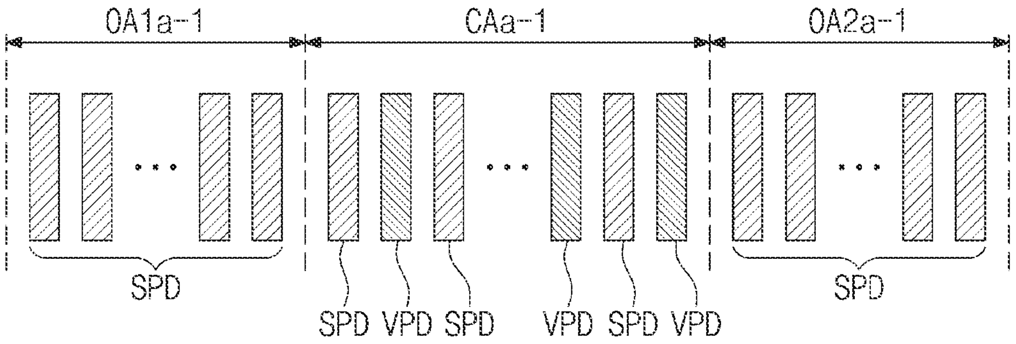
FIG. 4B is a schematic plan view illustrating a plurality of pads according to an embodiment.

FIG. 4B is a schematic plan view illustrating pads according to an embodiment.

Referring to FIGS. 4A and 4B, first pads SPD to which a scan signal is applied and second pads VPD to which power is applied are illustrated. The power may be a gate-off voltage or a low-potential voltage. The first pads SPD may be connected to the first partial gate lines GL1*pa*, respectively, and the second pads VPD may be connected to the respective auxiliary lines AL-C disposed in the first area AR1.

First pads SPD may be arranged in the first direction DR1 to correspond to the first outer area OA1*a*-1, one first pad SPD and one second pad VPD may be alternately and repeatedly arranged in the first direction DR1 to correspond to the central area CAa-1, and first pads SPD may be arranged in the first direction DR1 to correspond to the second outer area OA2*a*-1.

Figure 5:
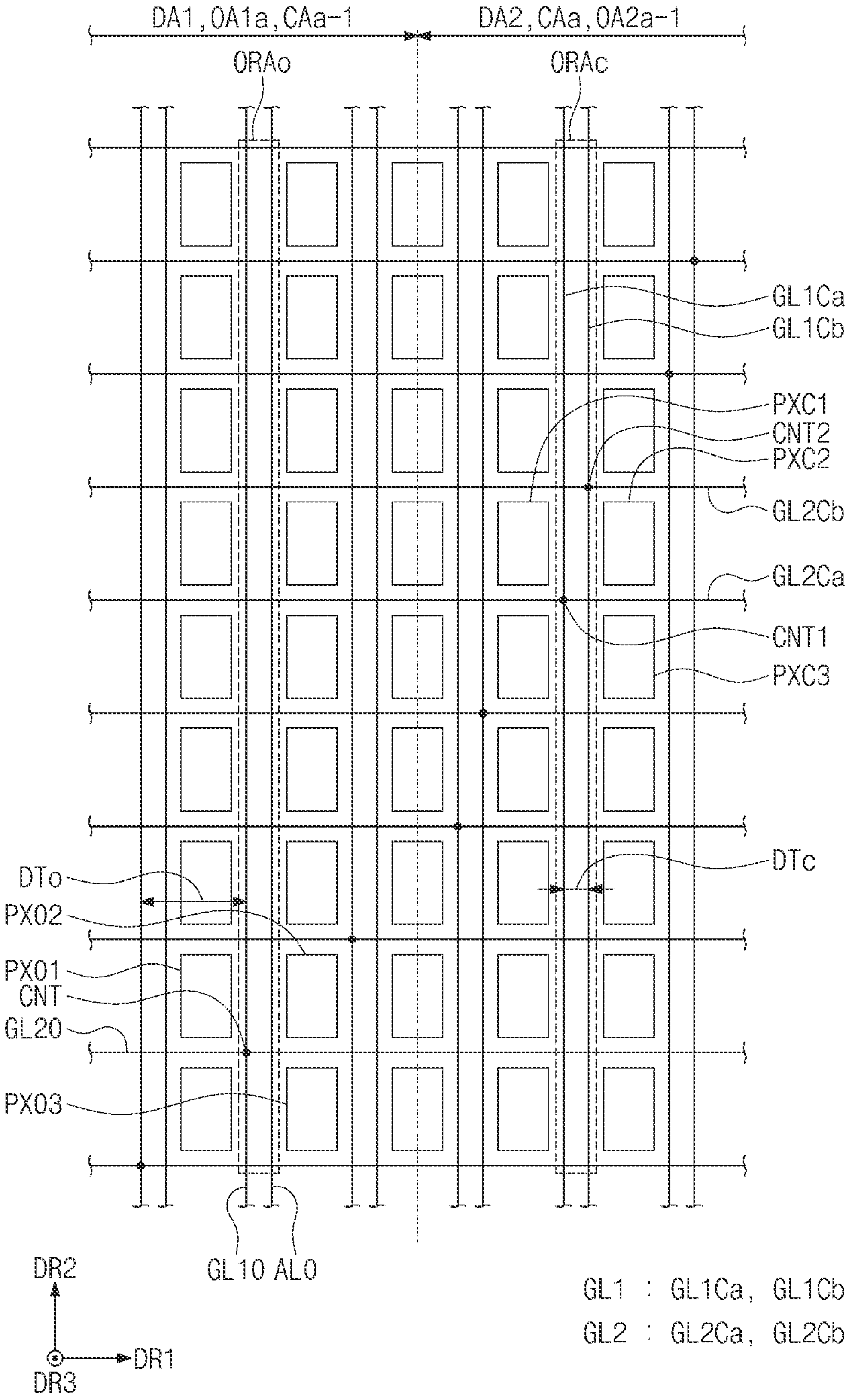
FIG. 5 is a schematic plan view illustrating some components of a display panel according to an embodiment.

FIG. 5 is a schematic plan view illustrating some components of the display panel according to an embodiment. The arrangement relationship between the first partial gate lines GL1*pa* and the auxiliary lines AL in the first outer area OA1*a* and the central area CAa described with reference to FIG. 3A may correspond to the arrangement relationship between the first partial gate lines GL1*pa* and the auxiliary lines AL-C in the central area CAa-1 and the second outer area OA2*a*-1 described with reference to FIG. 4A. Accordingly, in FIG. 5, a first divided area DA1 and a second divided area DA2 are illustrated, the reference numerals of the first outer area OA1*a* and the central area CAa-1 are written together in the first divided area DA1, and the reference numerals of the central area CAa and the second outer area OA2*a*-1 are written together in the second divided area DA2.

Referring to FIGS. 2 and 5, the pixels PX may include a first pixel PXO1, a second pixel PXO2, and a third pixel PXO3 that are disposed in the first divided area DA1. The first pixel PXO1 and the second pixel PXO2 may be adjacent to each other in the first direction DR1, and the third pixel PXO3 may be adjacent to the second pixel PXO2 in the second direction DR2.

The first gate lines GL1 may include one first gate line GL1O disposed between the first pixel PXO1 and the second pixel PXO2, and the auxiliary lines AL may include one auxiliary line ALO disposed between the first pixel PXO1 and the second pixel PXO2.

An overlapping area ORAo that is defined (or disposed) between the first pixel PXO1 and the second pixel PXO2 and that extends in the second direction DR2 and overlaps (or crosses) the entire width of the display panel 100 in the second direction DR2 may be included in the display panel 100. The one first gate line GL1O may be electrically connected to one second gate line GL2O through a contact portion CNT. As only the one first gate line GL1O is disposed between the first pixel PXO1 and the second pixel PXO2 disposed in the first divided area DA1, the number of contact portions CNT disposed in the overlapping area ORAo among contact portions through which the first gate lines GL1 are electrically connected to the second gate lines GL2, respectively, may be one.

The pixels PX may include a first pixel PXC1, a second pixel PXC2, and a third pixel PXC3 that are disposed in the second divided area DA2. The first pixel PXC1 and the second pixel PXC2 may be adjacent to each other in the first direction DR1, and the third pixel PXC3 may be adjacent to the second pixel PXC2 in the second direction DR2.

The first gate lines GL1 may include two first intermediate gate lines GL1Ca and GL1Cb (e.g., first gate lines) disposed between the first pixel PXC1 and the second pixel PXC2. The second gate lines GL2 may include two second intermediate gate lines GL2Ca and GL2Cb (e.g., second gate lines) disposed between the first pixel PXC1 and the second pixel PXC2. The first intermediate gate line GL1Ca may be electrically connected to the second intermediate gate line GL2Ca through a first contact portion CNT1, and the first intermediate gate line GL1Cb may be electrically connected to the second intermediate gate line GL2Cb through a second contact portion CNT2.

An overlapping area ORAc that is defined (or disposed) between the first pixel PXC1 and the second pixel PXC2 and that extends in the second direction DR2 and overlaps (or crosses) the entire width of the display panel 100 in the second direction DR2 may be included in the display panel 100. The two first intermediate gate lines GL1Ca and GL1Cb may be electrically connected to the two second intermediate gate lines GL2Ca and GL2Cb through the first and second contact portions CNT1 and CNT2. Accordingly, the first and second contact portions CNT1 and CNT2 may be disposed in the overlapping area ORAc.

In the first divided area DA1, only the one first gate line GL1O may be disposed between the two pixels PXO1 and PXO2 spaced apart from each other in the first direction DR1. Furthermore, in the second divided area DA2, the two first intermediate gate lines GL1Ca and GL1Cb may be disposed between the two pixels PXC1 and PXC2 spaced apart from each other in the first direction DR1. Accordingly, the minimum gap DTo between the first gate lines GL1O in the first divided area DA1 may be greater than the minimum gap DTc between the first intermediate gate lines GL1Ca and GL1Cb in the second divided area DA2.

Referring to the embodiment illustrated in FIG. 3A and FIG. 5, the minimum gap DTo between the first gate lines GL1*x* in the first outer area OA1*a* may be greater than the minimum gap DTc between the first gate lines GL1*y* in the central area CAa. Referring to the embodiment illustrated in FIG. 4A and FIG. 5, the minimum gap DTo between the first gate lines GL1*y* in the central area CAa-1 may be greater than the minimum gap DTc between the first gate lines GL1*x* in the second outer area OA2*a*-1.

According to an embodiment, the auxiliary lines AL (refer to FIG. 2) and the first gate lines GL1 may be alternately and repeatedly arranged in a partial area without being intensively disposed in a specific area. As the first gate lines GL1 (refer to FIG. 2) are not intensively disposed in a specific area, a load difference between pixels receiving scan signals from different gate drivers among the adjacent pixels may be decreased, and thus the display quality of the display device 1000 (refer to FIG. 1) may be improved or enhanced.

Figure 6:
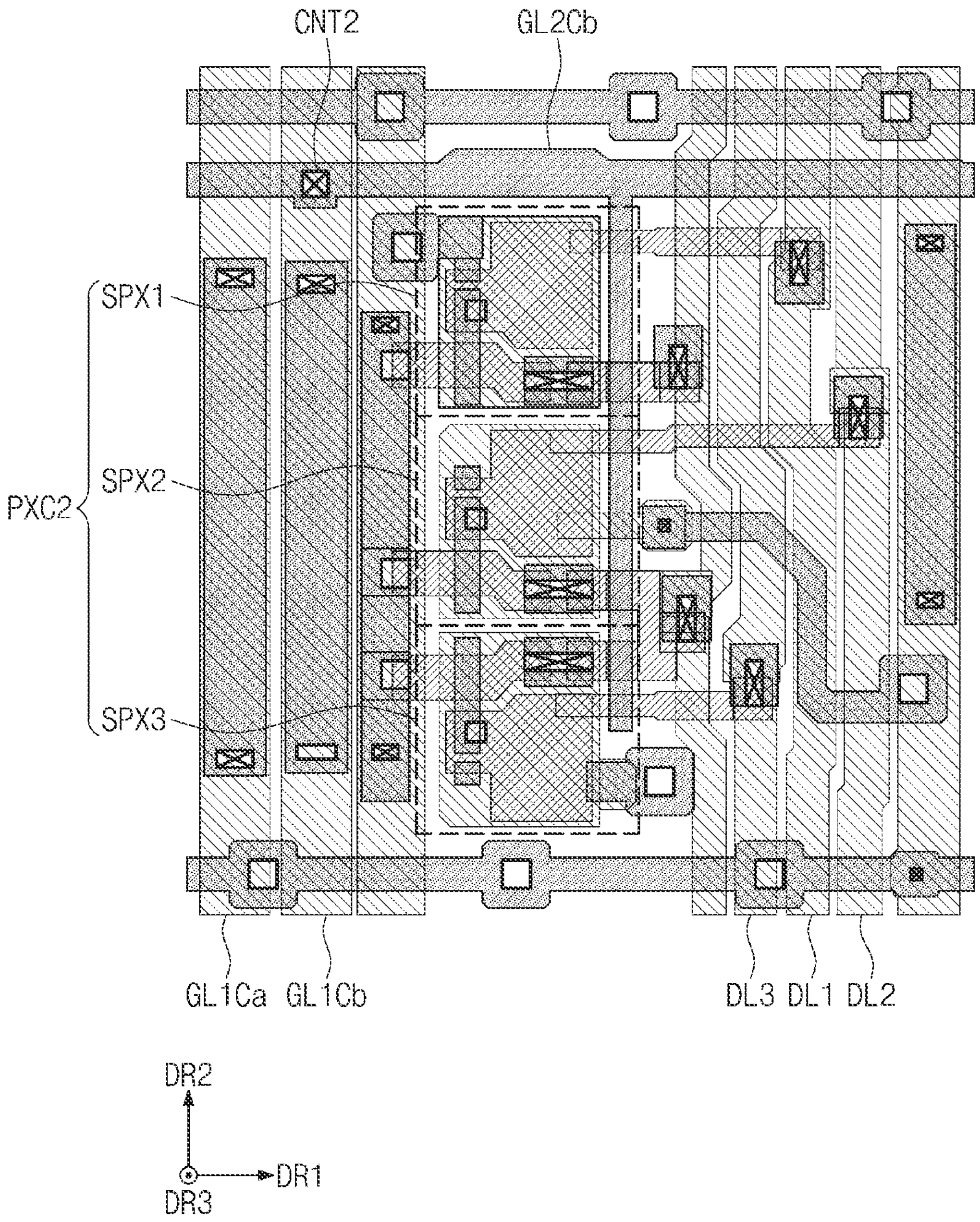
FIG. 6 is a schematic enlarged plan view of a portion of the display panel according to an embodiment.

FIG. 6 is a schematic enlarged plan view of a portion of the display panel according to an embodiment. In FIG. 6, the second pixel PXC2 disposed in the second divided area DA2 is illustrated.

Referring to FIGS. 2, 5, and 6, each of the pixels PX may include a first sub-pixel SPX1, a second sub-pixel SPX2, and a third sub-pixel SPX3. The two first intermediate gate lines GL1Ca and GL1Cb among the first gate lines GL1 and three data lines DL1, DL2, and DL3 among the data lines DL may be spaced apart from each other, and the first, second, and third sub-pixels SPX1, SPX2, and SPX3 may be disposed between the two first intermediate gate lines GL1Ca and GL1Cb and the three data lines DL1, DL2, and DL3, e.g., in a plan view.

Figure 7:
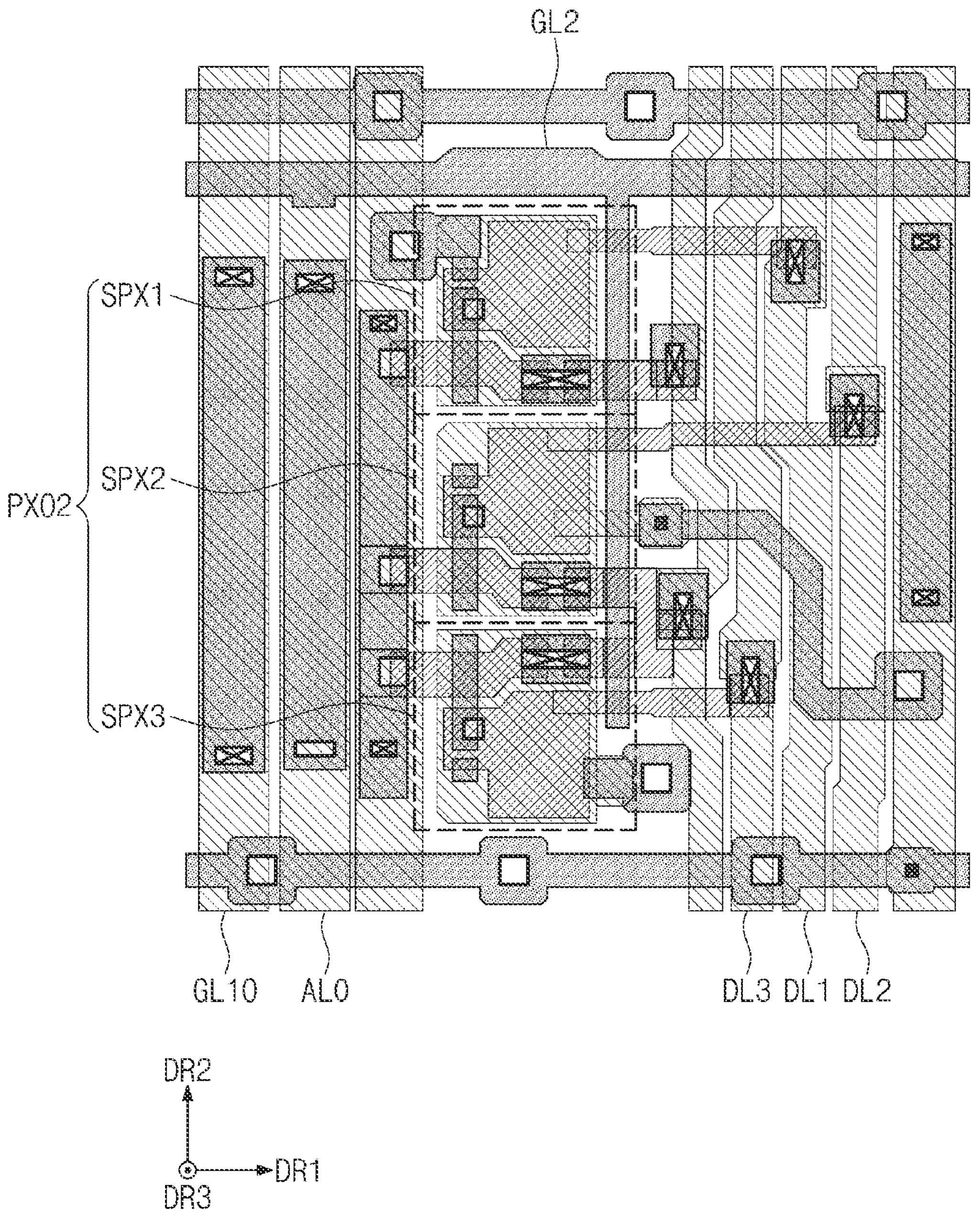
FIG. 7 is a schematic enlarged plan view of a portion of the display panel according to an embodiment.

FIG. 7 is a schematic enlarged plan view of a portion of the display panel according to an embodiment. In FIG. 7, the second pixel PXO2 disposed in the first divided area DA1 is illustrated.

Referring to FIGS. 5 and 7, the first gate line GL1O and the auxiliary line ALO may be spaced apart from the three data lines DL1, DL2, and DL3, and the first, second, and third sub-pixels SPX1, SPX2, and SPX3 may be disposed between the first gate line GL1O and the auxiliary line ALO may be spaced apart from the three data lines DL1, DL2, and DL3, e.g., in a plan view.

Referring to FIGS. 6 and 7, the second pixel PXO2 disposed in the first divided area DA1 and the second pixel PXC2 disposed in the second divided area DA2 may have similar layouts. One of lines adjacent to the second pixel PXO2 of the first divided area DA1 that correspond to the two first intermediate gate lines GL1Ca and GL1Cb disposed adjacent to the second pixel PXC2 disposed in the second divided area DA2 may be the first gate line GL1O, and the other may be the auxiliary line ALO.

According to an embodiment, the auxiliary lines AL (refer to FIG. 2) and the first gate lines GL1 may be alternately and repeatedly arranged in a partial area, for example, the second divided area DA2 without being intensively disposed in a specific area. Accordingly, the first gate lines GL1 may be disposed to be relatively evenly distributed, and a load difference between pixels receiving scan signals from different gate drivers among the adjacent pixels may be decreased. Thus, the display quality of the display device 1000 (refer to FIG. 1) may be improved or enhanced.

As described above, the auxiliary lines and the first gate lines may be alternately and repeatedly arranged in a partial area without being intensively disposed in a specific area. Accordingly, the first gate lines may be disposed to be relatively evenly distributed, and a difference in load between a pixel receiving a scan signal from the first gate driver and a pixel receiving a scan signal from the second gate driver among adjacent pixels may be decreased. Thus, a luminance difference caused by the load difference may be decreased, and the display quality of the display device may be improved or enhanced.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:

a display panel including:

a plurality of pixels;

a plurality of data lines arranged in a first direction;

a plurality of first gate lines arranged in the first direction;

a plurality of auxiliary lines arranged in the first direction; and a plurality of second gate lines arranged in a second direction intersecting the first direction and electrically connected to the plurality of first gate lines;

a first circuit film coupled to the display panel, the first circuit film including a first gate driver and a first data driver; and a second circuit film coupled to the display panel and spaced apart from the first circuit film in the first direction, the second circuit film including a second gate driver and a second data driver, wherein the plurality of first gate lines include:

a plurality of first partial gate lines that receive a signal from the first gate driver; and a plurality of second partial gate lines that receive a signal from the second gate driver, at least some of the plurality of auxiliary lines are disposed between the plurality of first partial gate lines and the plurality of second partial gate lines, the plurality of pixels include a first pixel and a second pixel adjacent to each other in the first direction, and the plurality of first gate lines include at least two first intermediate gate lines disposed between the first pixel and the second pixel, the plurality of pixels further include a third pixel and a fourth pixel adjacent to each other in the first direction, the plurality of first gate lines include at least one first gate line disposed between the third pixel and the fourth pixel, and the plurality of auxiliary lines include at least one auxiliary line disposed between the third pixel and the fourth pixel.

2. The display device of claim 1, wherein the plurality of pixels further include a fifth pixel adjacent to the second pixel in the second direction, the plurality of second gate lines include at least two second intermediate gate lines spaced apart from each other, the first pixel and the second pixel are disposed between the at least two second intermediate gate lines, one of the at least two first intermediate gate lines is electrically connected to one of the at least two second intermediate gate lines through a first contact portion, and another one of the at least two first intermediate gate lines is electrically connected to another one of the at least two second intermediate gate lines through a second contact portion.

3. The display device of claim 1, wherein the display panel further includes an overlapping area disposed between the first pixel and the second pixel and extending in the second direction to cross an entire width of the display panel in the second direction, and a number of contact portions disposed in the overlapping area among contact portions through which the plurality of first gate lines are electrically connected to the plurality of second gate lines, respectively, is two.

4. The display device of claim 1, wherein the display panel further includes an overlapping area disposed between the third pixel and the fourth pixel and extending in the second direction to cross an entire width of the display panel in the second direction, and a number of contact portions disposed in the overlapping area among contact portions through which the plurality of first gate lines are electrically connected to the plurality of second gate lines, respectively, is one.

5. The display device of claim 1, wherein each of the plurality of pixels includes a first sub-pixel, a second sub-pixel, and a third sub-pixel, at least two first gate lines among the plurality of first gate lines and at least three data lines among the plurality of data lines are spaced apart from each other, and the first, second, and third sub-pixels are disposed between the at least two first gate lines and the at least three data lines.

6. The display device of claim 1, wherein each of the plurality of pixels includes a first sub-pixel, a second sub-pixel, and a third sub-pixel, at least one first gate line among the plurality of first gate lines and at least one auxiliary line among the plurality of auxiliary lines are spaced apart from at least three data lines among the plurality of data lines, and the first, second, and third sub-pixels are disposed between the at least one first gate line, and the at least one auxiliary line, and the at least three data lines.

7. The display device of claim 1, wherein the display panel includes:

a first area in which the first partial gate lines are disposed; and a second area in which the second partial gate lines are disposed, and each of the first area and the second area includes a central area, a first outer area, and a second outer area spaced apart from each other, the central area disposed between the first outer area and the second outer area.

8. The display device of claim 1, wherein a gate-off voltage or a low-potential voltage is applied to the plurality of auxiliary lines.

9. The display device of claim 7, wherein the plurality of auxiliary lines are disposed only in the first outer area and the second outer area, and in each of the first outer area and the second outer area, the plurality of auxiliary lines and the plurality of first gate lines are alternately arranged one by one.

10. The display device of claim 9, wherein a minimum gap between first gate lines disposed in the central area among the plurality of first gate lines is smaller than a minimum gap between first gate lines disposed in the first outer area among the plurality of first gate lines.

11. A display device comprising:

a display panel including:

a plurality of pixels;

a plurality of data lines arranged in the first direction;

a plurality of first gate lines arranged in the first direction; and a plurality of auxiliary arranged in the first direction; and a plurality of second gate lines arranged in a second direction intersecting the first direction and electrically connected to the plurality of first gate lines;

a first circuit film coupled to the display panel, the first circuit film including a first gate driver and a first data driver; and a second circuit film coupled to the display panel and spaced apart from the first circuit film in the first direction, the second circuit film including a second gate driver and a second data driver, wherein the plurality of first gate lines include:

a plurality of first partial gate lines receive a signal from the first gate driver; and a plurality of second partial gate lines that receive a signal from the second gate driver, at least some of the plurality of auxiliary lines are disposed between the plurality of first partial gate lines and the plurality of second partial gate lines the display panel includes:

a first area in which the plurality of first partial gate lines are disposed; and a second area in which the plurality of second partial gate lines are disposed, each of the first area and the second area includes a central area, a first outer area, and a second outer area spaced apart from each other, the central area disposed between the first outer area and the second outer area, the plurality of auxiliary lines are disposed only in the central area, and in the central area, the plurality of auxiliary lines and the plurality of first gate lines are alternately arranged one by one.

12. The display device of claim 11, wherein a minimum gap between first gate lines disposed in the central area among the plurality of first gate lines is greater than a minimum gap between first gate lines disposed in the first outer area among the plurality of first gate lines.

13. An electronic device comprising:

a display device including a display panel including:

a plurality of pixels;

a plurality of data lines arranged in a first direction;

a plurality of first gate lines arranged in the first direction;

a plurality of auxiliary lines arranged in the first direction; and a plurality of second gate lines arranged in a second direction intersecting the first direction and electrically connected to the plurality of first gate lines; and a first circuit film coupled to the display panel, the first circuit film including a first gate driver and a first data driver, wherein at least two of the plurality of first gate lines are disposed between two of the plurality of pixels that are adjacent to each other in the first direction, and at least one of the plurality of first gate lines and at least one of the plurality of auxiliary lines are disposed between another two of the plurality of pixels that are adjacent to each other in the first direction.

14. The electronic device of claim 13, wherein a gate-off voltage or a low-potential voltage is applied to the plurality of auxiliary lines.

15. The electronic device of claim 13, wherein the display panel further includes a first overlapping area disposed between the two adjacent pixels and extending in the second direction to cross an entire width of the display panel in the second direction, a number of contact portions disposed in the first overlapping area among contact portions through which the plurality of first gate lines are electrically connected to the plurality of second gate lines, respectively, is two, the display panel further includes a second overlapping area disposed between the other two adjacent pixels and extending in the second direction to cross an entire width of the display panel in the second direction, and a number of contact portions disposed in the second overlapping area among the contact portions through which the plurality of first gate lines are electrically connected to the plurality of second gate lines, respectively, is one.

16. The electronic device of claim 13, further comprising:

a second circuit film coupled to the display panel and spaced apart from the first circuit film in the first direction, the second circuit film including a second gate driver and a second data driver, wherein the display panel includes:

a first area in which some of the first gate lines receiving a signal from the first gate driver are disposed, and a second area in which other first gate lines receiving a signal from the second gate driver are disposed, and each of the first area and the second area includes a central area, and a first outer area and a second outer area spaced apart from each other, the central area disposed between the first outer area and the second outer area.

17. The electronic device of claim 16, wherein the two adjacent pixels are disposed in the central area, and the other two adjacent pixels are disposed in the first outer area or the second outer area.

18. The electronic device of claim 16, wherein the two adjacent pixels are disposed in the first outer area or the second outer area, and the other two adjacent pixels are disposed in the central area.

* * * * *